United States Patent [19]

Mizuta

[11] Patent Number: 4,889,498

[45] Date of Patent: Dec. 26, 1989

[54] MEMORY CARD HAVING AN ELASTOMER CONNECTOR

[75] Inventor: Masaharu Mizuta, Itami, Japan

[73] Assignee: Mitsubishi Denki Kabushiki Kaisha, Japan

[21] Appl. No.: 259,809

[22] Filed: Oct. 19, 1988

[30] Foreign Application Priority Data

Oct. 21, 1987 [JP] Japan ............................ 62-161530[U]

[51] Int. Cl.⁴ ............................................... H01B 4/58
[52] U.S. Cl. ...................................... 439/86; 439/140;
439/137; 439/76
[58] Field of Search .............. 439/79, 86, 87, 137–142

[56] References Cited

U.S. PATENT DOCUMENTS

| 4,008,300 | 2/1977 | Ponn | 439/86 |
|---|---|---|---|
| 4,514,024 | 4/1985 | Clark | 439/139 |
| 4,639,062 | 1/1987 | Taniguchi et al. | 439/86 |
| 4,754,546 | 7/1988 | Lee et al. | 439/86 |
| 4,767,348 | 8/1988 | Murakami | 439/140 |
| 4,780,793 | 10/1988 | Ohtsuki | 439/137 |
| 4,789,347 | 12/1988 | Banjo et al. | 439/140 |
| 4,791,608 | 12/1988 | Fushimoto | 439/137 |

FOREIGN PATENT DOCUMENTS 2087665  5/1982  United Kingdom ................. 439/86

Primary Examiner—P. Austin Bradley
Attorney, Agent, or Firm—Leydig, Voit & Mayer

[57] ABSTRACT

A memory card with a connector having a male contact including a relatively large numbers of connecting pins. The card comprises a card-shaped housing in which a female contact is disposed to be accessible by the male contact from the outside of the housing. The housing also contains therein internal conductors between internal components and the female contact. The female contact comprises an elastomer connector having an electrically insulating elastomer and a large number of electrically conductive fine fibers, each having a first and a second end. The conductive fibers extend through and are supported by the insulating elastomer for establishing a large number of independent electrically conductive paths therethrough. The dimensions and the pitch of the conductive fibers is so fine that the respective conductors and the corresponding external male pin are electrically connected through at least one of the conductive fibers when the male and female contact are connected. A spring-biased, slidable shutter may be provided to selectively cover or expose the female contact. The exposure may be either on a side surface or a major surface of the housing.

7 Claims, 2 Drawing Sheets

MEMORY CARD HAVING AN ELASTOMER CONNECTOR

BACKGROUND OF THE INVENTION

This invention relates to a memory card and more particularly to a memory card connectable to a computer peripheral device through an electrical connector.

Generally, in order to obtain reliable electrical connections and to enable connection and disconnection to be repeatedly performed, a memory card is connected to a computer peripheral device by means of a two-piece connector. A twopiece connector comprises female contacts which are secured to the memory card and pin contacts which are secured to the peripheral device to which the memory card is to be connected. The force required to connect and disconnect a pin contact and a conventional female contact is approximately 80 grams per pin, so for a 60-pin two-piece connector, the total force required for connecting or disconnecting is 80 grams×60 pins=4.8 kg. With a force of this magnitude, connection and disconnection are difficult to perform, and accordingly there is a great interest in reducing the number of pins required for electrical connection of a memory card. By using the socalled I/O bus method, only 20 pins are required for a memory card having a capacity of up to 8 megabytes, so the connecting and disconnecting force for such a memory card is reduced to 80 grams×20 pins=1.6 kg. However, this force is still too high to enable easy connection and disconnection, and there many cases in which the reading and writing of data into a memory card can not be performed due to incomplete connection using a conventional two-piece connector. Furthermore, this force is too high to enable use of an automatic loading mechanism such as is used for 3.5″ floppy disks.

In order to solve the problem of connecting a memory card to a peripheral device, memory cards have been proposed which employ radio wave couplers, optical couplers, or magnetic couplers instead of conventional two-piece connectors. For example, Japan LSI Card Co. has manufactured a memory card employing a magnetic coupler. However, all of these memory cards have drawbacks with respect to cost, the area of the interface portion, data access speed, and power consumption. Accordingly, there is still a great need for a memory card connector which can be connected to a peripheral device as easily as a floppy disk can be loaded into a disk drive. In particular, there is a desire for a memory card which can be automatically connected to a peripheral device by an automatic loader, just as a 3.5″ floppy disk can be automatically loaded into a disk drive.

SUMMARY OF THE INVENTION

Accordingly, it is an object of the present invention to provide an electrical connector which can be used to connect a memory card to a computer peripheral device with the exertion of only a small force.

It is another object of the present invention to provide a memory card which employs this connector.

It is still another object of the present invention to provide a memory card which is suitable for being automatically connected to a peripheral device by an automatic loading device.

It is yet another object of the present invention to provide a memory card which can be used interchangeably with a conventional floppy disk.

According to the present invention, there is provided a memory card with a connector having a male contact including a relatively large numbers of connecting pins. The card comprises a card-shaped housing in which a female contact is disposed to be accessible by the male contact from the outside of the housing. The housing also contains therein internal conductors between internal components and the female contact. The female contact comprises an elastomer connector having an electrically insulating elastomer and a large number of electrically conductive fine fibers having a first and a second end. The conductive fibers extend through and are supported by the insulating elastomer for establishing a large number of independent electrically conductive paths therethrough. The dimensions and the pitch of the conductive fibers are so fine that the respective internal conductors and the corresponding external male pin are electrically connected through at least one of the conductive fibers when the male and female contact are connected.

A spring-biased, slidable shutter may be provided to selectively cover or expose the female contact. The exposure may be either on a side surface or a major surface of the housing.

BRIEF DESCRIPTION OF THE DRAWINGS

The present invention will become more readily apparent from the following detailed description of the preferred embodiment of the present invention taken in conjunction with the accompanying drawings, in which.

DESCRIPTION OF THE PREFERRED EMBODIMENTS

Figure 3:
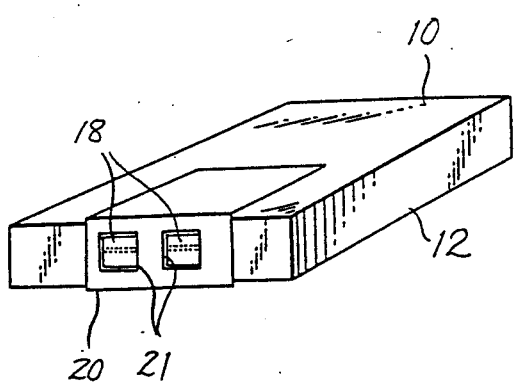
FIG. 3 is a perspective view of the memory card shown in FIG. 1 with the shutter in the open position.
Figure 4:
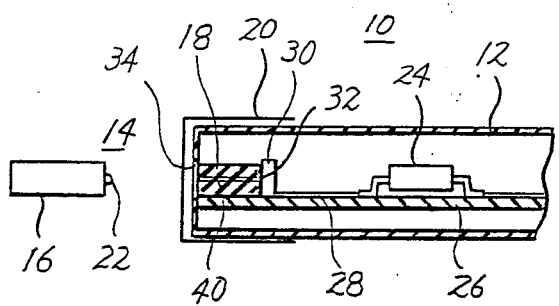
FIG. 4 is a sectional side view of the connector portion of the memory card shown in FIG. 2.
Figure 5:
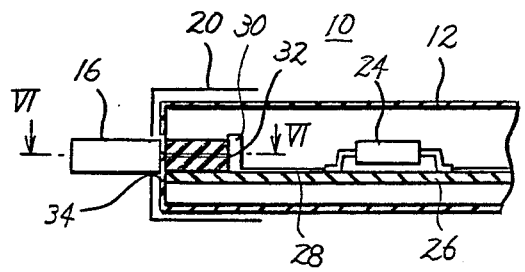
FIG. 5 is a sectional side view of the connector portion of the memory card similar to that shown in FIG. 4 with the shutter in the open position and the male contact connected.

A memory card 10 of the present invention comprises a substantially card-shaped housing 12 made preferably of a plastic material and is electrically connectable to an external electrical device such as a computer peripheral device (not shown) through two connectors 14 (only one is seen in FIGS. 4 and 5) each composed of a male contact 16 and a female contact 18. The memory card 10 also comprises a shutter 20 slidably mounted on the housing 12. The shutter 20 has two windows 21 open on the side of the housing 12 and is movable between a closed position shown in FIG. 2 in which the shutter 20 covers the female contacts 18 and an open position shown in FIG. 3 in which the female contacts 18 are exposed and can be accessed by the male contacts 16 (see FIG. 4). The shutter 20 is biased toward the closed position by a spring 23.

In FIG. 4, the male contact 16 includes a plurality of electrically conductive connecting pins 22 electrically insulated and supported by a male contact main body in an array of a relatively fine pitch. The male contact 16 illustrated has twenty connecting pins 22, ten for one group to be connected to one of the female contacts 18 and other ten of the other group to be connected to the other female contact 18 disposed within the housing 12. However, the present invention is equally applicable to a contact having as many as sixty-eight pins.

The memory card 10 comprises in the housing 12 various electronic components 24 (only one is illustrated) such as ICs disposed within the housing 12. The housing 12 may preferably have the same outer shape and dimensions as a jacket of a 3.5" floppy disk. The electronic component 24 is mounted to a circuit board 26 and is electrically connected to other components by a printed circuit pattern 28. It is seen that the circuit board 26 has a raised portion 30 on which a plurality of terminals 32 of the printed circuit pattern 28 are attached.

The female contact 18 of the connector 14 of the memory card 10 is disposed within the housing 12 and accessible by the male contact 16 from outside of the housing 12 through an access port 34 formed in a side wall of the housing 12. The access port 34 may be formed in one of the major surfaces of the housing 12 with the female contact oriented accordingly. The female contact 18 is supported between the edge of the access port 34 and the raised portion 30 on which terminals 32 of the printed circuit pattern 28 are disposed. Therefore, these terminals 32 on the raised surface portion 30 are electrically connected to the female contact 18 and then to the electronic component 24 disposed within the housing 12.

The female contact 18 of the memory card 10 of the present invention comprises an elastic connector known as an elastomer connector which may be the one commercially available under the trade name "Interconnector" Type HL from Shinetsu Polymer Co. Ltd. Japan. The elastomer connector comprises an electrically insulating elastomer 38 such as rubber and silicone and a large number of electrically conductive fine fibers 40 such as metallic and carbon fibers embedded in the elastomer 38 so that they extend through the elastomer 38 parallel to each other. One end of each of the conductive fibers 40 is exposed at the end surfaces of the elastomer 38. Thus, these conductive fibers 40 form a large number of independent electrical paths extending between the end surfaces of the block-shaped elastomer 38.

Figure 6:
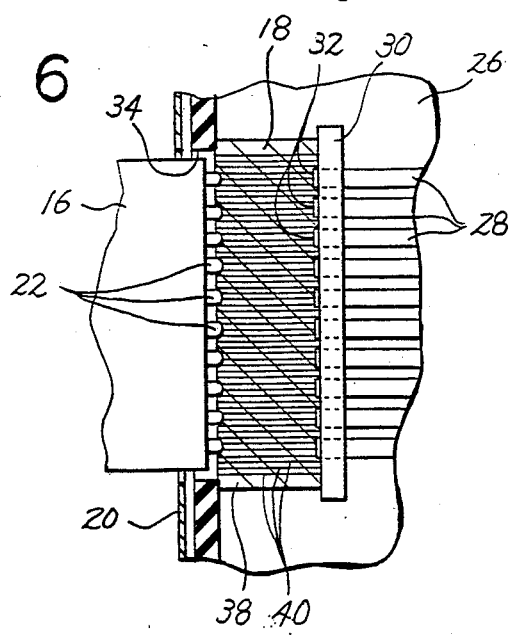
FIG. 6 is a sectional plan view of the connector portion taken along line VI—VI of FIG. 5.

As best seen in FIGS. 4 to 6, the female contact 18 is brought into contact under pressure with the terminals 32 of the circuit pattern 28 on the raised portion 30, so that the first ends of some of the conductive fibers 40 are brought into contact under pressure with the terminals 32. The second ends of the conductive fibers 40 face the access port 34. Therefore, when the connecting pins 22 of the male contact 16 are inserted into the access port 34, each of the connecting pins 22 is pressed against the second ends of at least one of the conductive fibers 40 to establish an electrical connection therebetween. Since these particular conductive fibers 40 are electrically connected to one of the circuit pattern terminals 32 as previously described, at least one electrical path is established through at least one of the electrically conductive fibers 40 between each of the connecting pins 22 and the corresponding one of the terminals 32 which is to be connected to the pin 22.

The male contact 16 may be mounted at the bottom of a disc slot of a computer peripheral device (not shown). When the memory card 10 of the present invention is inserted into such a disc slot of the terminal, a known shutter-opening mechanism (not shown) causes the shutter 20 to slide against the spring biasing force of the biasing spring 23 (FIG. 2) into the open position shown in FIG. 3 to allow access of the male contact 16 to the female contact 18. A further insertion of the card 10 causes the connecting pins 22 of the male contact 16 to be pressed against at least one of the conductive fibers 40 of the female contact 18 which is electrically connected at the first end to the terminals 32 which, in turn, is connected to the printed circuit pattern 28 for the electronic components 24 within the housing 12. At the same time, a known latch mechanism (not shown) mounted in the terminal device maintains the memory card 10 in this connected position with the disc slot until it is released.

Figure 1:
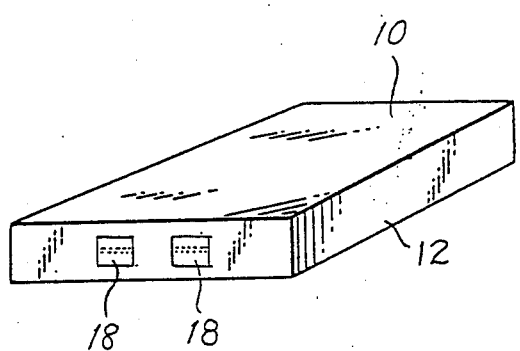
FIG. 1 is a perspective view of one embodiment of a memory card of the present invention with a shutter removed for easy explanation.
Figure 2:
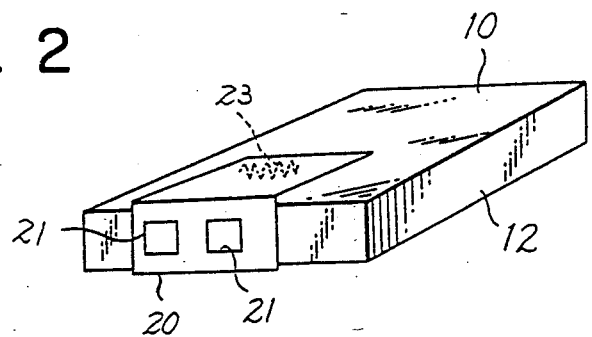
FIG. 2 is a perspective view of the memory card shown in FIG. 1 with the shutter in the closed position.

As shown in FIGS. 4 to 6, the memory card 10 can be electrically connected to a peripheral device by male contacts 16 in the form of pin contacts. When the shutter 20 is closed as shown in FIGS. 2 and 4, the female contacts 18 are protected, and when the shutter 20 is moved sideways to its open position, as shown in FIGS. 3, 5 and 6, the pin contacts 16 can be inserted into the female contacts 18 through the windows 34, whereby electrical connections are made. Because the female contacts 18 are made of an elastomer connector, a highly reliable electrical connection can be made between the female contact 18 and the male contact 16 with a very small connecting and disconnecting force. On account of the small magnitude of the force, it is possible to employ an automatic loading device for connecting the memory card 10 to a peripheral device similar to that used for a 3.5" floppy disk drive.

For example, an automatic loading device could be employed which automatically slides the shutter 20 from its closed to its open position and at the same time advances the male contact 16 towards the memory card 10 and connects the male contact 16 with the female contacts 18 through the windows 34 of the shutter 20.

In the illustrated embodiment, the elastomeric female contact 18 opens onto one of the end surfaces of the jacket 12 of the memory card 10, but it is also possible for the female contact 18 to be disposed so as to open onto the top or bottom surface of the jacket 12 and for the pin contact 16 to approach the female contact 18 from above or below.

As this embodiment of a memory card in accordance with the present invention has the same shape as a conventional 3.5" floppy disk, a conventional disk drive for a 3.5" floppy disk could be easily altered so as to read and write with respect to either a floppy disk or a memory card. This could be accomplished by providing the disk drive with a mechanism for sensing the difference between a 3.5" floppy disk and a memory card based on the location of the shutter windows 21, for example, and by providing a mechanism for bringing male contact 16 in contact with the female contact 18 when the insertion into the disk drive of a memory card is detected.

What is claimed is:

1. A memory card electrically connectable to an external electrical device through a connector, said connector having a male contact including a plurality of connecting pins, said memory card comprising:

a card-shaped housing;
an electronic component disposed within said housing;
a female contact disposed within said housing and accessible by the male contact from outside of said housing; and
connecting means for electrically connecting said electronic component and said female contact,
said female contact comprising an elastomer connector having an electrically insulating elastomer and a plurality of electrically conductive fine fibers having a first and a second end, said conductive fibers extending through and supported by said elastomer for independent electrical conduction therethrough, the arrangement of said conductive fibers being such that each of said connecting means is electrically connected to the first end of at least one of said conductive fibers and each of the pins of the male connector is engageable with the second end of at least one of said conductive fibers.

2. A memory card as claimed in claim 1, comprising a shutter mounted on said housing and movable between a closed position in which said shutter covers said female contact and an open position in which said female contact can be accessed by the male contact.

3. A memory card as claimed in claim 2, wherein said shutter is slidable between said closed and said open positions, and further comprising a spring disposed between said shutter and said housing for biasing said shutter toward said closed position.

4. A memory card as claimed in claim 2, wherein said shutter has a window formed therein for allowing access therethrough to said female contact in said open position.

5. A memory card as claimed in claim 4, wherein said window of said shutter opens onto a side surface of said housing.

6. A memory card as claimed in claim 4, wherein said window of said shutter opens onto a major surface of said housing.

7. A memory card as claimed in claim 1, wherein said housing has the same outer shape and dimensions as a jacket of a 3.5" floppy disk.

* * * * *